(12) United States Patent
Miyasaka

(10) Patent No.: US 6,815,830 B2
(45) Date of Patent: Nov. 9, 2004

(54) SEMICONDUCTOR DEVICE AND METHOD OF MANUFACTURING THE SAME, CIRCUIT BOARD AND ELECTRONIC INSTRUMENT

(75) Inventor: Hideo Miyasaka, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/794,666

(22) Filed: Feb. 28, 2001

(65) Prior Publication Data

US 2001/0031515 A1 Oct. 18, 2001

(30) Foreign Application Priority Data

Mar. 10, 2000 (JP) ......................................... 2000-066035

(51) Int. Cl.$^7$ .................. H01L 23/48; H01L 23/52; H01L 29/40; H01L 21/44; H01L 21/48
(52) U.S. Cl. ................... 257/778; 438/109; 228/180.22
(58) Field of Search ............................... 257/778, 746; 438/108; 228/180.22

(56) References Cited

U.S. PATENT DOCUMENTS

| | | | | |
|---|---|---|---|---|
| 5,459,368 A | * | 10/1995 | Onishi et al. | ............... 310/313 |
| 5,918,113 A | * | 6/1999 | Higashi et al. | ............. 438/119 |
| 6,153,939 A | * | 11/2000 | Wang et al. | ................. 257/778 |

FOREIGN PATENT DOCUMENTS

| | | | |
|---|---|---|---|
| JP | A-6-204272 | 7/1994 | |
| JP | A-10-261661 | 9/1998 | |
| JP | A-10-294547 | 11/1998 | |
| JP | A-11-330299 | 11/1999 | |
| JP | P2000-332164 | * 11/2000 | ........... H01L/23/28 |

* cited by examiner

Primary Examiner—Craig A. Thompson
Assistant Examiner—Nema Berezny
(74) Attorney, Agent, or Firm—Oliff & Berridge, PLC

(57) ABSTRACT

A method of manufacturing a semiconductor device, including a first step of placing a resin between one surface of a semiconductor chip, having a plurality of electrodes formed thereon, and a substrate having a wiring pattern formed thereon and defining at least one through-hole in the region in which the semiconductor chip is to be mounted on the substrate, to form a space therebetween that opens into the through-hole, and a second step of pressing either one of the semiconductor chip and the substrate against the other to thereby bond the semiconductor chip to the substrate.

5 Claims, 6 Drawing Sheets

(A)

(B)

(A)

(B)

(A)

(B)

SEMICONDUCTOR DEVICE AND METHOD OF MANUFACTURING THE SAME, CIRCUIT BOARD AND ELECTRONIC INSTRUMENT

BACKGROUND OF THE INVENTION

1. Field of the Invention

The present invention relates to a semiconductor device and a method of manufacturing it, and to a circuit board and electronic instruments incorporating the semiconductor device.

2. Description of the Related Art

As one type of CSP (chip scale/size package) semiconductor devices, known is a face-down bonding (flip chip bonding) structure with semiconductor chips on a substrate. For example, it is known to fabricate a semiconductor device by providing an anisotropic conductive material on the entire surface of a substrate on which semiconductor chips are to be mounted, followed by mounting semiconductor chips thereon.

However, the anisotropic conductive material provided on the entire surface of the substrate, on which semiconductor chips are to be mounted, extends around the semiconductor chips mounted on the substrate due to the stress applied thereto when the semiconductor chips are mounted on the substrate, and will often form bubbles around the edges of the mounted semiconductor chips. In addition, since the contact area between the two is large, bubbles may also be formed somewhere therein. These bubbles often reduce the reliability of the semiconductor device.

SUMMARY OF THE INVENTION

The invention is to solve the above problems, and its object is to provide a highly reliable semiconductor device and a method of manufacturing it, and also a circuit board and electronic instrument incorporating the semiconductor device.

A method of manufacturing a semiconductor device in accordance with the invention includes:
  a first step of putting a resin between one surface of a semiconductor chip having a plurality of electrodes formed thereon, and a substrate having a wiring pattern formed thereon and having at least one through-hole in a region in which the semiconductor chip is to be mounted on the substrate, to form a space therebetween that opens into the through-hole, and
  a second step of pressing either one of the semiconductor chip and the substrate against the other to thereby bond the semiconductor chip to the substrate.

A semiconductor device in accordance with the invention includes:
  a semiconductor chip having a plurality of electrodes,
  a substrate having a wiring pattern formed thereon, with the semiconductor chip being face-down bonded thereto, and having at least one through-hole in a region in which the semiconductor chip is mounted on the substrate, and
  a resin placed at least between the semiconductor chip and the substrate, the resin being placed therebetween to form a space that opens into the through-hole.

DETAILED DESCRIPTION OF THE PREFERRED EMBODIMENTS

Figure 1:
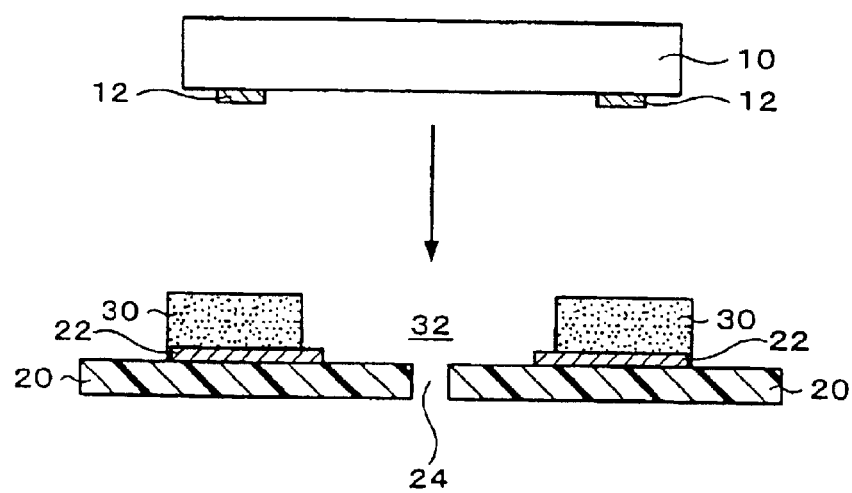
FIG. 1(A) and FIG. 1(B) are views illustrating a first embodiment of the semiconductor device, and a method of manufacturing it.
Figure 1:
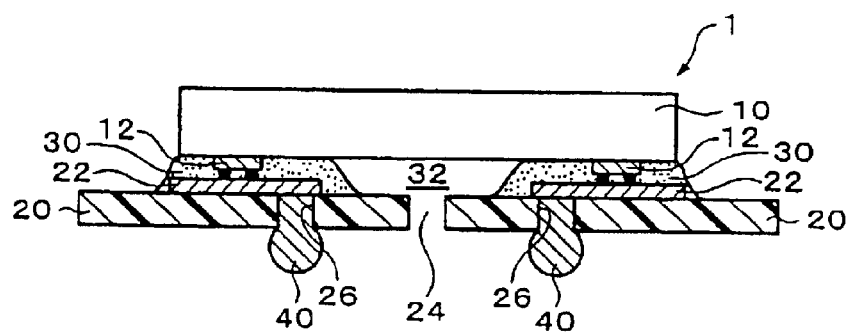

A method of manufacturing a semiconductor device in accordance with a first characteristic of the invention includes;
  a first step of placing a resin between one surface of a semiconductor chip, having a plurality of electrodes formed thereon, and a substrate having a wiring pattern formed thereon and having at least one through-hole in a region in which the semiconductor chip is to be mounted on the substrate, to form a space therebetween that opens into the through-hole, and
  a second step of pressing at least one of the semiconductor chip and the substrate against the other to thereby bond the semiconductor chip to the substrate.

According to this structure, the resin is made to extend inside the region in which the semiconductor chip is to be mounted on the substrate, and the amount of the resin that may extend outside the region can be reduced. Accordingly, this structure obviates bubbles that may be formed by the resin extending outside the region to engulf the edge of the semiconductor chip. In addition, since the contact area between the semiconductor chip and the resin is small, few bubbles are formed between the two. Even when some bubbles are formed they may be removed through the through-hole of the substrate. Accordingly, semiconductor devices of high reliability can be manufactured.

Embodiments of the invention are mentioned below.

(1) In the method of manufacturing a semiconductor device in accordance with the first characteristic of the above invention, the resin is placed on the substrate in the first step to form a recessed or holed space thereon that opens into the through-hole.

According to this constitution, the resin forms a recess or a hole that opens into the through-hole, and it is made to extend inside the region in which the semiconductor chip is to be mounted on the substrate. The resin flow toward the recess or the hole can be promoted by removing air through the through-hole that opens into the recess or the hole.

(2) In the method of manufacturing a semiconductor device in accordance with the first characteristic of the above invention, as the electrodes are formed along the two opposite sides of the semiconductor chip, and
  in the first step, the resin is placed along the two sides.

In this constitution, the resin is placed along the two opposite sides of the semiconductor chip along which the electrodes are formed. Accordingly, it is easy to place a smaller amount of the resin in the intended region.

(3) In the method of manufacturing a semiconductor device in accordance with the first characteristic of the above invention, the electrodes are formed in the peripheral area of the semiconductor chip, and in the first step, the resin is put in the site corresponding to the region that is inside the region of the semiconductor chip in which the electrodes are formed.

In this constitution, the range of the resin to extend outside can be reduced. Accordingly, for example, the resin can be kept within the range of the region in which the semiconductor chip is to be mounted on the substrate. Therefore, since the resin does not engulf the edge of the semiconductor chip, this structure is more effective for preventing the formation of bubbles around the edge of the semiconductor chip.

(4) In the method of manufacturing a semiconductor device in accordance with the first characteristic of the above invention, the resin is placed within a range so as not to overstep the region in which the semiconductor chip is to be mounted on the substrate in the second step.

In this constitution, the resin is placed within a range not overstepping the region in which the semiconductor chip is to be mounted on the substrate. Specifically, since the resin does not engulf the edge of the semiconductor chip, this structure is more effective for preventing the formation of bubbles around the edge of the semiconductor chip.

(5) In the method of manufacturing a semiconductor device in accordance with the first characteristic constitution of the above invention, the resin contains conductive particles, and in the second step, the conductive particles are made to be between the electrodes and the wiring pattern. In this case, the resin may be an anisotropic conductive film.

According to this constitution, the electrodes can be electrically connected with the wiring pattern.

(6) The invention is also intended to cover a semiconductor device manufactured according to any of the above-mentioned, semiconductor device-manufacturing methods.

(7) A semiconductor device in accordance with the invention includes:

a semiconductor chip having a plurality of electrodes, a substrate having a wiring pattern formed thereon, with the semiconductor chip being face-down bonded thereto, and having at least one through-hole in the region in which the semiconductor chip is mounted on the substrate, and a resin placed at least between the semiconductor chip and the substrate, the resin being placed therebetween to form a space that opens into the through-hole.

In this constitution, the resin is made to extend in the space that opens into the through-hole of the substrate, and the amount of the resin that may extend outside the region in which the semiconductor chip is mounted on the substrate can be reduced. Accordingly, this structure obviates bubbles that may be formed by the resin extending outside the region to engulf the edge of the semiconductor chip. In addition, since the contact area between the semiconductor chip and the resin is small, few bubbles are formed between the two. Even when some bubbles are formed, they may be removed through the through-hole of the substrate. Moreover, in the subsequent packaging step, moisture may be removed from the semiconductor device through the space surrounded by the resin to open into the through-hole of the substrate. Accordingly, highly reliable semiconductor devices can be provided.

(8) In the semiconductor device (7), the space is larger than the through-hole.

The advantage of this structure is that, in the subsequent packaging step, moisture can be removed more readily from the semiconductor device. Specifically, since the space surrounded by the resin is larger than the through-hole of the substrate, moisture can be removed more surely, for example, from the resin.

(9) In the semiconductor device (7), the resin is placed so as not to overstep the range of the region in which the semiconductor chip is mounted on the substrate.

In this structure, the resin is placed, so as not to overstep the range of the region in which the semiconductor chip is mounted on the substrate. Specifically, since the resin does not engulf the edge of the semiconductor chip, this structure is more effective for preventing the formation of bubbles around the edge of the semiconductor chip.

(10) In the semiconductor device (7), the resin contains conductive particles, and the conductive particles are placed between the electrodes and the wiring pattern.

In this case, the resin may be an anisotropic conductive film.

In this structure, the electrodes can be electrically connected with the wiring pattern.

(11) The invention is also intended to cover a circuit board having thereon, of any of above semiconductor devices (7) to (10).

(12) The invention is also intended to cover an electronic instrument having therein any of the above semiconductor devices (7) to (10).

Some preferred embodiments of the invention are described hereinunder with reference to the drawings attached hereto, which, however, are not intended to restrict the scope of the invention.

First Embodiment

Figure 2:
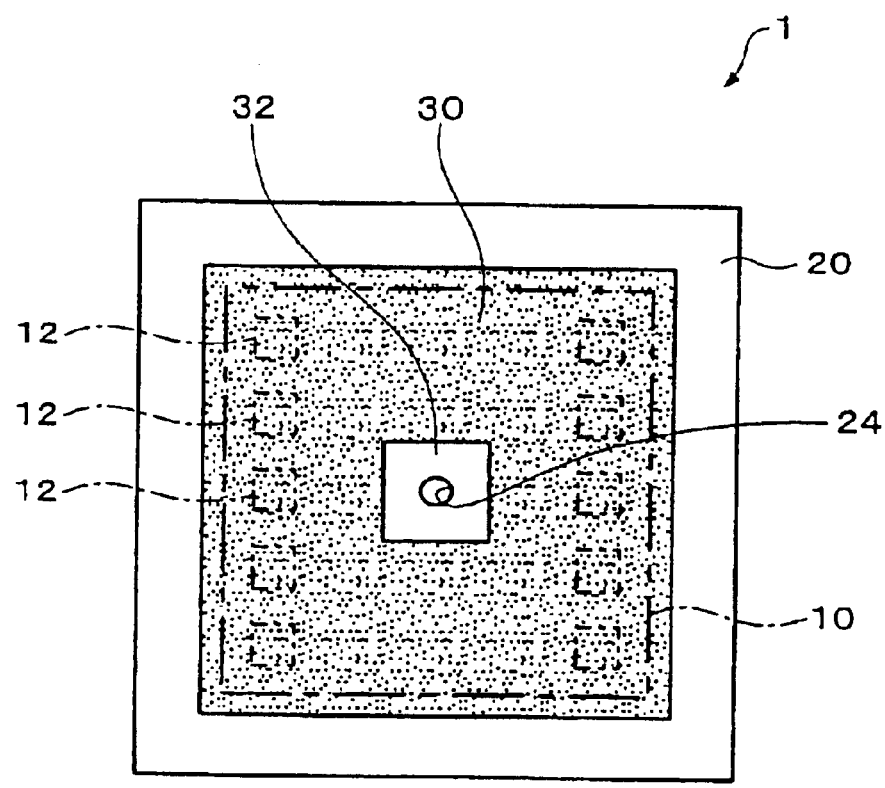
FIG. 2 is a plan view of the semiconductor device of the first embodiment.

FIG. 1(A) through FIG. 2 are views illustrating the semiconductor device of this embodiment and a method of manufacturing it. Precisely, FIG. 1(A) is a view illustrating a method of manufacturing the semiconductor device of this embodiment; and FIG. 1(B) is a view showing the semiconductor device manufactured according to the method. FIG. 2 is a plan view of the semiconductor device of FIG. 1(B). The semiconductor device of this embodiment includes a semiconductor chip 10, a substrate 20, and a resin. The structure of the semiconductor device of this embodiment is described below.

As in FIG. 1(B), the semiconductor chip 10 has a plurality of electrodes (or pads) 12 made of, for example, aluminum. The plurality of electrodes 12 may be aligned in the peripheral area of the semiconductor chip 10, or in the center area of the semiconductor chip 10. When the semiconductor chip 10 has a rectangular face, the electrodes 12 may be aligned along the parallel two sides of the rectangular semiconductor chip 10, or may be aligned along the four sides thereof. An insulating film (now shown) is formed on the semiconductor chip 10, so as not to cover at least a part of the surface of each electrode 12. The insulating film may be made of, for example, $SiO_2$, SiN, polyimide resin. Optionally, bumps (not shown) of solder balls, gold wire balls, gold plates or the like may be formed on the electrodes 12. In this case, a bump metal diffusion preventive layer of nickel, chromium, titanium or the like may be disposed between the electrode 12 and the bump.

As in FIG. 1(B), the substrate 20 may be made of any material of organic or inorganic substances, or may have an organic/inorganic composite structure. One example of the substrate 20 made of an organic material is a flexible substrate of polyimide resin. Ceramic substrates and glass substrates are examples of the substrate 20 made of an inorganic material. Glass-epoxy substrates are examples of the substrate 20 having an organic/inorganic composite structure. For the substrate 20, also employable are multi-layered substrates and built-up substrates.

The wiring pattern 22 is formed on one or both surfaces of the substrate 20. In many cases, the wiring pattern 22 has a multi-layered structure. For example, any of copper (Cu), chromium (Cr), titanium (Ti), nickel (Ni) and titanium-tungsten (Ti—W) may be layered to form the wiring pattern 22. The wiring pattern 22 may be formed through photolithography, sputtering or plating. A part of the wiring pattern may form a land (not shown) of which the area is larger than the wiring area. The land ensures electric connection in the device, and is often formed to act as an electric contact with the electrodes 12 of the semiconductor chip 10 or with external terminals 40.

As in FIG. 1(B) and FIG. 2, the substrate 20 is worked to have at least one through-hole (that is, one or more through-holes) 24 in the region in which the semiconductor chip 10 is mounted thereon. The through-hole 24 opens at both surfaces of the substrates 20. The through-hole 24 may be formed substantially at the center of the region in which the semiconductor chip 10 is mounted on the substrate 20. The shape and the size of the through-hole 24 are not specifically defined, and may be such that air can be removed through it. The through-hole 24 can be formed, for example, by punching or etching the substrate.

The substrate 20 may be worked to have via-holes 26 for external connection, in addition to the through-hole 24. Through the via-holes 26, both surfaces of the substrate 20 can be electrically connected with each other. In case where the substrate 20 has the via-holes 26 formed therethrough, a part of the wiring pattern 22 extends over the via-holes 26. The part of the wiring pattern 22 that extends thereover may be a land (not shown). Irrespective of the profile of the wiring pattern 22 formed on the substrate 20, the via-holes 26, if any, ensure electric connection with the wiring pattern 22 on the both sides of the substrate 20.

As shown in FIG. 1(B), the semiconductor chip 10 is face-down bonded to the substrate 20. In this case, the mode of electric connection between the electrodes 12 and the wiring pattern 22 includes bonding of the two with conductive resin paste, or metallic bonding with Au—Au, Au—Sn, solder or the like, or bonding through contraction of insulating resin, any of which is employable herein. For example, as in FIG. 1(B), the semiconductor chip 10 may be face-down bonded to the substrate 20 with an anisotropic conductive material 30 containing conductive particles. As the case may be, the two may be face-down bonded to each other with bumps (not shown) disposed on the electrodes 12 of the semiconductor chip 10. The bumps may be formed according to a ball-bumping method in which a bonding wire is used, or an electroplating method, an electroless plating method, a paste printing method, a ball-mounting method, or a combination of such methods. The semiconductor device of this embodiment may have a stacked structure of such that a plurality of semiconductor chips 10 are layered on the substrate 20.

As in FIG. 1(B), a resin is placed between the semiconductor chip 10 and the substrate 20. The resin may contain conductive particles, like the anisotropic conductive material 30. Precisely, the anisotropic conductive material 30 contains conductive particles (conductive filler) dispersed in an adhesive (binder). The conductive particles in the anisotropic conductive material 30 are placed between the electrodes 12 and the wiring pattern 22. Accordingly, the two are electrically connected with each other. Apart from this, the resin may be an under-filler. The under-filler may have the function of relaxing the stress in the semiconductor device. This may protect the electric connection between the electrodes 12 and the wiring pattern 22.

As shown in FIG. 1(B) and FIG. 2, the anisotropic conductive material 30 is placed to form a space that opens into the through-hole 24. In this embodiment, the anisotropic conductive material 30 is disposed to cover the periphery of the region in which the semiconductor chip 10 is mounted, thereby forming a frame structure wherein the outer periphery is nearly analogous to the periphery of the semiconductor chip 10, as in FIG. 2 which shows the plan view of the substrate 20. In other words, a hole 32 surrounded by the anisotropic conductive material 30 is formed between the semiconductor chip 10 and the substrate 20, and the hole 32 opens into the through-hole 24. The size of the space that opens into the through-hole 24 can be of nearly any size. For example, in case where the hole 32 is larger than the through-hole 24, moisture (for example, the moisture in the anisotropic conductive material 30) can be more surely removed from the semiconductor device when the semiconductor device is treated at high temperatures.

A plurality of external terminals 40 may be disposed to be in contact with the wiring pattern 22. For example, external terminals 40 may be disposed to be in contact with the wiring pattern 22 through the via-holes 26 formed through the substrate 20, as in FIG. 1(B). Precisely, the external terminals 40 are connected with a part of the wiring pattern 22 (for example, with the land thereof) exposed outside via the via-holes 26, and these external terminals 40 protrude from the surface of the substrate 20 opposite to the surface thereof that faces the semiconductor chip 10. The external terminals 40 may be made of solder. For example, solder which becomes solder balls, is filled into each via-hole 26 to form a solder ball-integrated conductive member fitted in each via-hole 26. The external terminals 40 do not have to be formed using solder, and instead the external terminals 40 may be made of any other metal or conductive resin. The external terminals 40, can be formed by any of FAN-IN, FAN-OUT or FAN-IN/OUT, modes, for example, as in FIG. 1(B).

The external terminals 40 do not have to be intentionally formed in the manner described above, and solder cream can be applied to the mother board, for mounting the device thereon, to form external terminals. In this case, the solder cream can finally form external terminals due to the surface tension of its melt. The semiconductor device of this type is a land-grid-array device having a land that forms external terminals. If desired, a land may be formed on the surface of the substrate 20 opposite to the surface thereof having the wiring pattern 22 thereon and facing the semiconductor chip 10, and the land may be electrically connected with the wiring pattern 22 via the via-holes 26. Also if desired, the through-hole 26 may be filled with an conductive material, and its surface may serve as a land.

The substrate 20 may be partly extended for external connection at the extended part thereof. A part of the substrate 20 may be a lead for a connector, or a connector may be mounted on the substrate 20, or the wiring pattern 22 formed on the substrate 20 may be directly connected with other electronic instruments.

The method of manufacturing the semiconductor device of this embodiment is described below.

First Step

As in FIG. 1(A), an anisotropic conductive material 30 is placed between the semiconductor chip 10 and the substrate 20. The anisotropic conductive material 30 may be placed on at least the semiconductor chip 10 or the substrate 20. The anisotropic conductive material 30 is disposed on any of the two in such a manner that it forms a space that opens into the through-hole 24 when the semiconductor chip 10 is combined with the substrate 20. The anisotropic conductive material 30 may be either an anisotropic conductive film previously formed to be a sheet, or a liquid-type, anisotropic conductive paste.

In this embodiment, the anisotropic conductive material 30 is disposed to cover the periphery of the region in which the semiconductor chip 10 is to be mounted, thereby forming a frame structure of which the outer periphery is nearly analogous to the periphery of the semiconductor chip 10, as in the plan view of the substrate 20. In this case, the anisotropic conductive material 30 may to a certain degree overstep the region of the substrate 20 in which the semiconductor chip 10 is to be mounted on the substrate 20. Accordingly, the anisotropic conductive material 30 can be easily and surely disposed in the intended area.

The anisotropic conductive material 30 forms a space that opens into the through-hole 24. Precisely, space defines a hole 32 surrounded by the anisotropic conductive material 30. The opening of the hole 32 can be of any size, and it may be determined depending on the profile of the hole 32 to be formed by the anisotropic conductive material 30 that extends toward the hole 32 in the subsequent step.

For example, after the anisotropic conductive material 30 (for example, anisotropic conductive paste) has been spread entirely in the region of the substrate 20 in which the semiconductor chip 10 is to be mounted on the substrate 20, a part of the anisotropic conductive material 30, existing in and around the center of where the through-hole 24 is to be formed may be removed to form the hole 32. In that manner, for example, when the substrate 20 has a plurality of regions for a plurality of semiconductor chips 10 to be mounted thereon in the form of a matrix (not shown), the anisotropic conductive material 30 can be easily formed on the substrate 20 of that type and can readily define the hole 32 in every region for each semiconductor chip 10.

Second Step

Either one of the semiconductor chip 10 or the substrate 20 can be pressed against the other, whereby the electrodes 12 are electrically connected with the wiring pattern 22 via the conductive particles in the anisotropic conductive material 30. In this step, the semiconductor chip 10 may be heated. In case where the anisotropic conductive material 30 includes a thermosetting resin, the anisotropic conductive material 30 is once melted when heated, and then cured. In the case where anisotropic conductive material 30 is an anisotropic conductive film, it is once fluidized when heated. In case where resins differing from the anisotropic conductive material 30 are used, energy may be imparted to the resins in accordance with the curing mechanism of the resins used.

After being fluidized, the anisotropic conductive material 30 is compressed between the semiconductor chip 10 and the substrate 20, and extends between them. Specifically, the thus-fluidized anisotropic conductive material 30 runs in all directions inside and outside of the region in which the semiconductor chip 10 is mounted on the substrate 20, as in the plan view of the substrate 20. In this embodiment, the hole 32 that opens into the through-hole 24 is defined inside the region in which the semiconductor chip 10 is mounted on the substrate. Therefore, in this step, the anisotropic conductive material 30 can extend not only inside the chip-mounted region but also outside of the chip-mounted region. Specifically, the amount of the anisotropic conductive material 30 extending outside the chip-mounted region can be reduced, and the anisotropic conductive material 30 extending outside of the semiconductor chip 10 does not engulf the edge of the chip 10. Accordingly, few bubbles are formed around the edge of the semiconductor chip 10. In addition, since the contact area between the semiconductor chip 10 and the anisotropic conductive material 30 is small, few bubbles are formed therein. Even if some bubbles are formed, they can be removed through the through-hole 24 of the substrate 20. Accordingly, highly reliable semiconductor devices can be manufactured.

After being further heated, the fluidized anisotropic conductive material 30 is cured, and the hole 32 surrounded by the thus-cured material 30 is smaller than the original space surrounded by the non-cured material 30, as shown in FIG. 1(B). The cross-section of the hole 32 can be of any size.

Though not illustrated herein, the amount of the original anisotropic conductive material 30 and the original form of the hole 32 surrounded by the material 30 can be so controlled that the semiconductor device finally produced does not define the hole 32. In the embodiment not illustrated, the hole 32 that was formed in the first step of the manufacture process as in FIG. 1(A) is filled up with the anisotropic conductive material 30 that extends inside the chip-mounted region in the subsequent step. Even in this case, few bubbles are formed around the edge of the semiconductor chip 10 for the same reasons as above, and some bubbles, even if formed, can be removed through the through-hole 24.

Subsequent Steps

After the semiconductor chip 10 has been face-down bonded to the substrate via the anisotropic conductive material 30 or the like, external terminals 40 may be connected with the wiring pattern 22. In order to accomplish this, the external terminals 40 are formed under heat (this is a reflow step). Also in this step, the semiconductor device of this embodiment is effective. For example, in the semiconductor device of FIG. 1(B), moisture may be removed by heating it in the reflow step. Precisely, moisture in the anisotropic conductive material 30 that forms the hole 32 in the region in which the semiconductor chip 10 is mounted can be removed through the through-hole 24. In the case where the space of the hole 32 is larger than the size of the through-hole 24, moisture can be more effectively removed from the device through the through-hole 24.

In this embodiment, the resin extends inside the region in which the semiconductor chip 10 is mounted, and the amount of the resin that may extend outside of the region is reduced. Accordingly, the resin extending outside the chip-mounted region does not engulf the edge of the semiconductor chip 10 to form bubbles around the edge thereof. Therefore, highly reliable semiconductor devices can be manufactured.

Figure 3:
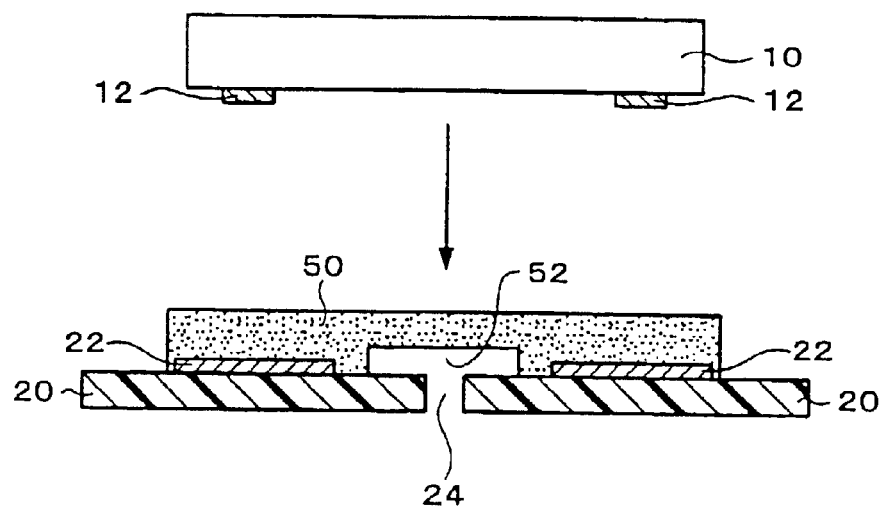
FIG. 3(A) and FIG. 3(B) are views illustrating a modification of the first embodiment of the semiconductor device, and a method of manufacturing it.
Figure 3:
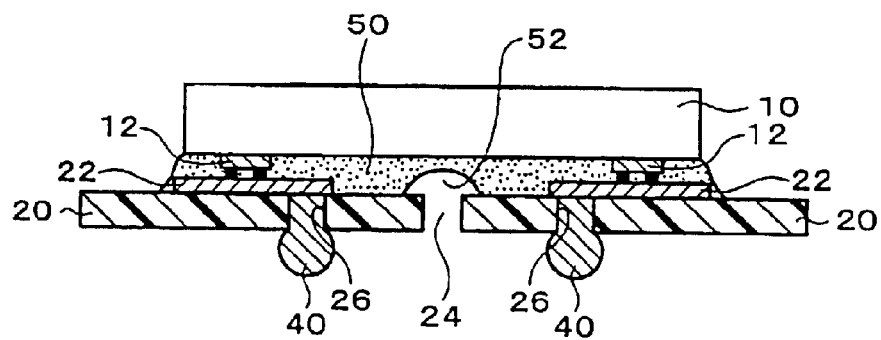

FIG. 3(A) and FIG. 3(B) are to illustrate a modification of the semiconductor device of this embodiment. In the semiconductor device of this modification, the behavior of the resin (anisotropic conductive material 50) differs from that in the above-mentioned embodiment. The structure of the semiconductor device of this modification and the method of manufacturing it may be substantially the same as those of the above-mentioned embodiment, except for the matters specifically described hereinunder.

As in FIG. 3(A), the method of manufacturing the semiconductor device of this modification includes forming a recess 52 in the anisotropic conductive material 50 having the same structure as discussed above. In this structure, the recess 52 opens into the through-hole 24. Concretely, the anisotropic conductive material 50 is formed to cover the entire surface of the semiconductor chip 10, but it does not cover the through-hole 24 and areas of the substrate 20 around the through-hole 24. Specifically, the anisotropic conductive material 50 is so disposed that it is recessed at and around the through-hole 24. In this structure, the anisotropic conductive material 50 can more easily extend inside the region in which the semiconductor chip 10 is mounted on the substrate 20.

The anisotropic conductive material 50 that extends inside the region in which the semiconductor chip 10 is mounted is cured by heating it in the subsequent step, whereby a space smaller than the original recess 52 may be formed, as in FIG. 3(B). Like in the above-mentioned embodiment, the recess 52 shown in FIG. 3(B) may be filled up, and the anisotropic conductive material 50 does not need to have the recess 52. The semiconductor device of this modification may be manufactured according to the method mentioned above.

Second Embodiment

Figure 4:
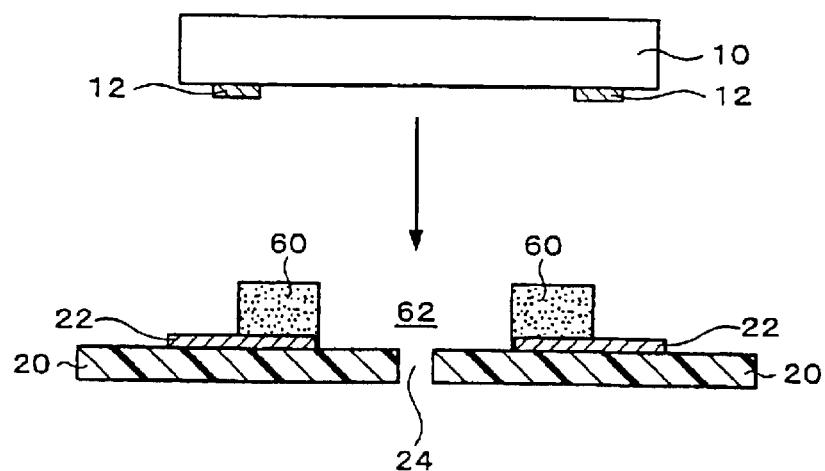
FIG. 4(A) and FIG. 4(B) are views illustrating a second embodiment of the semiconductor device, and a method of manufacturing it.
Figure 4:
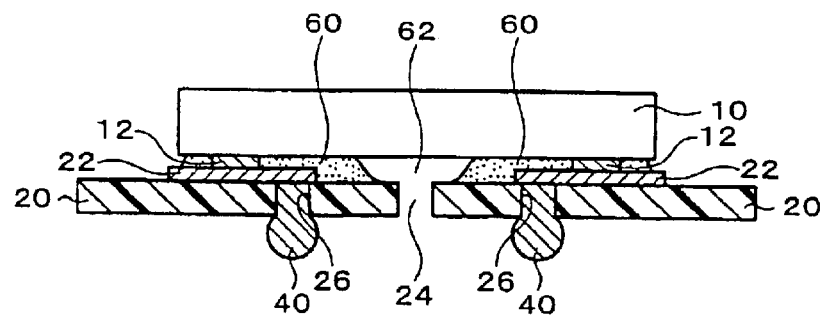

FIG. 4(A) and FIG. 4(B) are to illustrate a semiconductor device of this embodiment and a method of manufacturing it. Precisely, FIG. 4(A) is a view illustrating the method for manufacturing the semiconductor device of this embodiment; and FIG. 4(B) is a view showing the semiconductor device manufactured according to the method. In the semiconductor device of this embodiment, the behavior of the resin 60 differs from that in the above-mentioned embodiments. The resin 60 may be an under-filler. The under-filler may have the function of relaxing the stress in the semiconductor device. This function may protect the electric connection between the electrodes 12 and the wiring pattern 22. The semiconductor device of this embodiment and the method of manufacturing it may be substantially the same as those of the above-mentioned embodiments, except for the matters specifically described hereinunder.

The method of manufacturing the semiconductor device of this embodiment is first described below.

In this embodiment, the resin 60 is so disposed that it does not protrude outside the semiconductor chip 10 in the plan view when the semiconductor chip 10 is combined with the substrate 20.

For example, the first embodiment will be applied to this embodiment. In this, the resin 60 may be placed at a location that is inside the region of the semiconductor chip 10 in which the electrodes 12 are formed, in the plan view of the substrate 20, thereby forming a frame structure of which the outer periphery is nearly analogous to the periphery of the semiconductor chip 10. This structure may define a hole 62 that opens into the through-hole 24.

Similarly, on the other hand, the modification of the first embodiment will be applied to this embodiment. In this, the resin 60 may be placed at a location that is inside the region of the semiconductor chip 10 in which the electrodes 12 are formed, thereby forming a recess (not shown) that opens into the through-hole 24. The method for forming the hole 62 or the recess (not shown) and the effect of the hole 62 or the recess (not shown) are the same as those in the above-mentioned embodiments.

The resin 60 thus formed extends in all directions inside and outside the region in which the semiconductor chip 10 is mounted on the substrate, after the semiconductor chip 10 has been pressed against the substrate 20 and the two are heated. In this embodiment, the resin 60 is disposed at a location that is inside the region of the semiconductor chip 10 in which the electrodes 12 are formed. In this embodiment, therefore, the range of the resin 60 that may extend outside can be reduced. Accordingly, for example, the fluidized resin 60 is prevented from protruding outside the semiconductor chip 10 in the plan view of the substrate 20, as shown in FIG. 4(B). Specifically, the range of the resin 60 that extends outside is limited to the range of the region in which the semiconductor chip 10 is mounted. Accordingly, in this embodiment, the resin 60 is more surely prevented from reaching the edge of the semiconductor chip 10. Therefore, this structure is more effective for preventing the formation of bubbles around the edge of the semiconductor chip 10.

The semiconductor device of this embodiment is manufactured according to the method mentioned above. As shown in FIG. 4(B), the resin 60 may be provided so as not to protrude outside the semiconductor chip 10 in its plan view. The mode of electric connection between the electrodes 12 and the wiring pattern 22 in this embodiment may be metallic bonding or the like, as in the above-mentioned embodiments.

Third Embodiment

Figure 5:
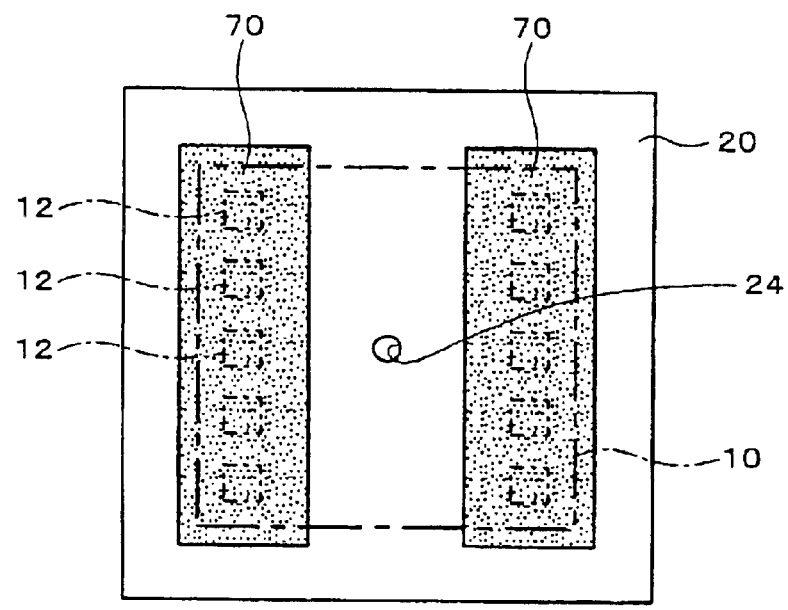
FIG. 5 is a plan view of a third embodiment of the semiconductor device.

FIG. 5 is a view illustrating a semiconductor device of this embodiment. In the semiconductor device of this embodiment, the structure of the resin (anisotropic conductive material 70) differs from that in the above-mentioned embodiments. The semiconductor device of this embodiment and the method of manufacturing it may be substantially the same as those of the above-mentioned embodiments, except for the matters specifically described hereinunder.

As in FIG. 5, the semiconductor of this embodiment is effective for the case in which the electrodes 12 are aligned along the two parallel sides of the semiconductor chip 10 mounted on the substrate. Specifically, in this, embodiment, the anisotropic conductive material 70 acts to ensure the electric connection between the electrodes 12 and the wiring pattern 22, and it is disposed along the two sides of the semiconductor chip 10 along which the electrodes 12 are aligned.

As in FIG. 5, the anisotropic conductive material 70 in the semiconductor device of this embodiment may be so disposed that it protrudes in some degree outside the region in which the semiconductor chip 10 is mounted on the substrate, like in the first embodiment. Though not shown, for example, the anisotropic conductive material 70 may be disposed so as not to overstep the region in which the semiconductor chip 10 is mounted on the substrate 20, in the plan view of the substrate 20, like in the second embodiment. The method of manufacturing the semiconductor device of this embodiment may be substantially the same as that described hereinabove.

In addition to the advantages of the other embodiments mentioned above, the semiconductor device of this embodiment has another advantage in that a smaller amount of resin may be disposed more easily therein.

Figure 6:
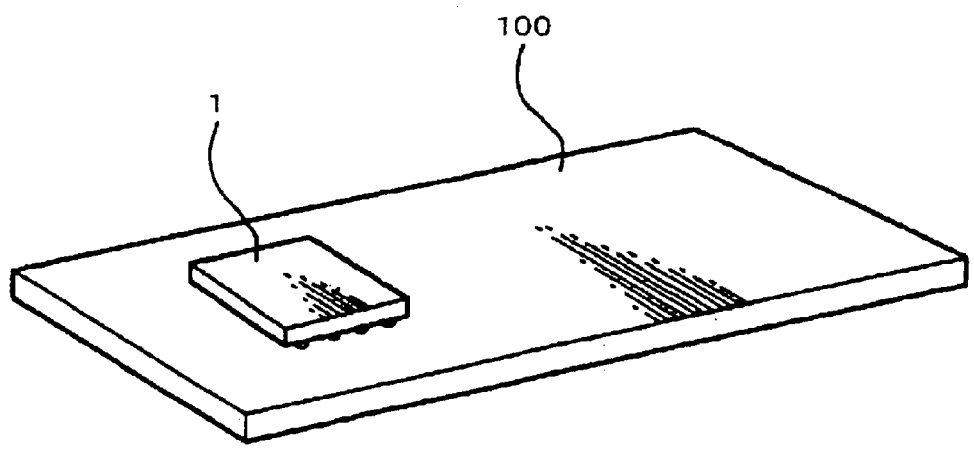
FIG. 6 is a view showing a circuit board on which is mounted a semiconductor device fabricated according to the invention.

FIG. 6 shows a circuit board 100 on which the semiconductor device 1 of any of the above-mentioned embodiments is mounted. For the circuit board 100, for example, can be an organic substrate such as a glass-epoxy substrate or the like. A wiring pattern of copper or the like, which provides a desired circuit, is formed on the circuit board 100. The wiring pattern is mechanically connected with the external terminals of the semiconductor device to ensure electric connection therebetween.

Figure 7:
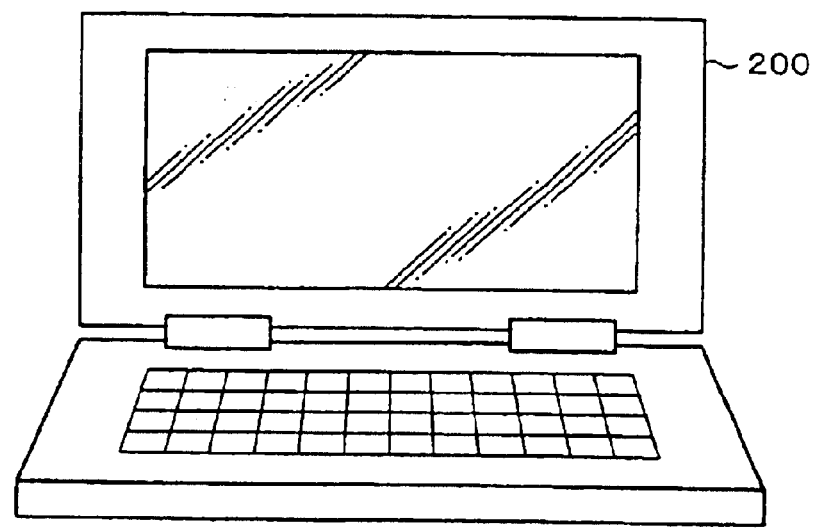
FIG. 7 is a view showing an electronic instrument having a semiconductor device fabricated according to the invention.
Figure 8:
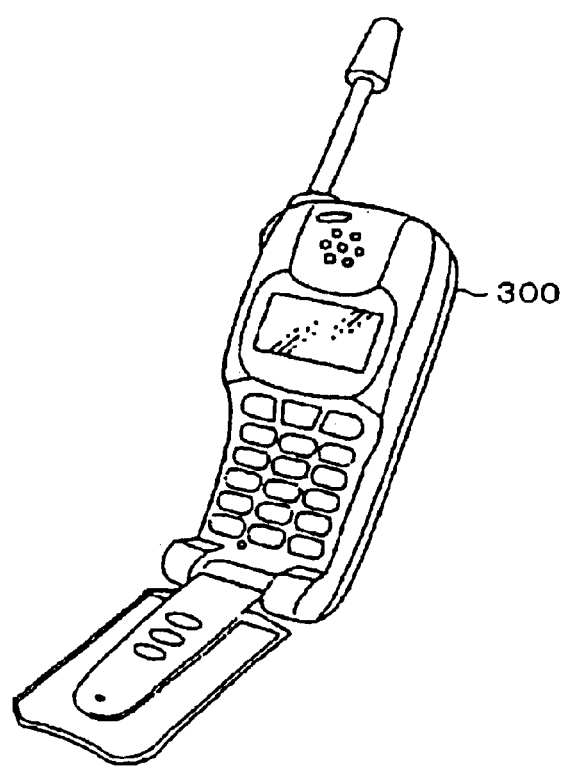
FIG. 8 is a view showing an electronic instrument having a semiconductor device fabricated according to the invention.

One example of electronic instruments equipped with the semiconductor device of the invention is a notebook-sized personal computer 200, as in FIG. 7; and another example thereof is a portable telephone 300, as shown in FIG. 8.

What is claimed is:

1. A semiconductor device, comprising:

a semiconductor chip having a plurality of electrodes;

a substrate having a wiring pattern formed thereon, the substrate having a region on which the semiconductor chip is face-down bonded, the substrate defining at least one air through-hole in the region on which the semiconductor chip is face-down bonded; and a resin disposed at least between the semiconductor chip and the substrate, the resin having a recess over the air through-hole, the recess being larger than the air through-hole, the resin containing conductive particles, the conductive particles being disposed between the electrode and the wiring pattern.

2. The semiconductor device as claimed in claim 1, the resin being disposed within the region in which the semiconductor chip is mounted on the substrate.

3. The semiconductor device as claimed in claim 1, the resin being an anisotropic conductive film.

4. A circuit board incorporating the semiconductor device of claim 1.

5. An electronic instrument incorporating the semiconductor device of claim 1.

* * * * *